(12) United States Patent
Gopalan et al.

(10) Patent No.: US 6,211,999 B1
(45) Date of Patent: Apr. 3, 2001

(54) LITHIUM TANTALATE SINGLE-CRYSTAL AND PHOTO-FUNCTIONAL DEVICE

(75) Inventors: Venkatraman Gopalan, State College, PA (US); Terence E. Mitchell, Los Alamos, NM (US); Kenji Kitamura; Yasunori Furukawa, both of Tsukuba (JP)

(73) Assignee: The Regents of the University of California, Los Alamos, NM (US)

( * ) Notice: Subject to any disclaimer, the term of this patent is extended or adjusted under 35 U.S.C. 154(b) by 0 days.

(21) Appl. No.: 09/183,826

(22) Filed: Oct. 30, 1998

(51) Int. Cl.$^7$ .................................................. G02F 1/355
(52) U.S. Cl. ................................. 359/326; 359/328
(58) Field of Search .................. 385/122; 359/326–332

(56) References Cited

U.S. PATENT DOCUMENTS 5,249,250 * 9/1993 Yamada et al. .................. 385/122
5,359,452 * 10/1994 Nitanda et al. .................. 359/328
5,943,465 * 8/1999 Kawaguchi et al. ............. 385/122
5,991,067 * 11/1999 Minakata et al. ................ 359/332

OTHER PUBLICATIONS

Kitamura et al., "Crystal Growth and Low Coercive Field 180° Domain Switching Characteristics of Stoichiometirc LiTaO$_3$," Applied Physics Letters, vol. 73, No. 21, pp. 3073–3075, Nov. 23, 1998.

Miyazawa et al., "Congruent Melting Composition of Lithium Metatantalate," Journal of Crystal Growth, vol. 10, pp. 276–278, 1971. (No Month).

* cited by examiner

Primary Examiner—John D. Lee
(74) Attorney, Agent, or Firm—Bruce H. Cottrell (57) ABSTRACT

Provided are lithium tantalate single-crystal that requires a low voltage of not larger than 10 kV/mm for its ferroelectric polarization inversion and of which the polarization can be periodically inverted with accuracy even at such a low voltage, and a photo-functional device comprising the crystal. The crystal has a molar fraction of Li$_2$O/(Ta$_2$O$_5$+Li$_2$O) of falling between 0.492 and 0.50. The functional device can convert a laser ray being incident thereon or can be used as a physical memory.

7 Claims, 5 Drawing Sheets

LITHIUM TANTALATE SINGLE-CRYSTAL AND PHOTO-FUNCTIONAL DEVICE

FIELD OF THE INVENTION

The present invention relates to lithium tantalate ($LiTaO_3$) single-crystal of many applications in various technical fields of optical information processing, optical working, photo-chemical reaction, optical instrumentation control and others where laser rays are used. The invention also relates to a photo-functional device comprising lithium tantalate single-crystal, in which the polarization of the crystal is periodically inverted to thereby shorten or prolong the fundamental wavelength of a laser ray being incident on the device. This invention is the result of a contract with the Department of Energy (Contract No. W7405-ENG-36).

BACKGROUND OF THE INVENTION

Lithium tantalate is well know as one of the most excellent and useful ferroelectric materials for piezoelectric, linear electro-optic and nonlinear optic device applications, besides lithium niobate, lithium tantalate has similar characteristics with those of lithium niobate in many respects, having the same crystal structure and a similar nature of nonstoichiometry. Although commonly referred to as "$LiTaO_3$", the phase exists over a wide solid solution range, from compositions near the stoichiometric value to Lithium-poor compositions. Therefore, the congruent melting composition, which is used in the conventional Czochralski method for the commercial crystal growth, also shifts towards the Ta excess composition side from the stoichiometric composition. In analogy with the nonstoichiometric defect model of lithium niobate, almost all lithium tantalate produced commercially should contain large amount of Ta anti-site defects and cation vacancies.

The phase diagram of lithium tantalate single-crystal was known from long ago. The $Li_2O$-$Ta_2O_5$ phase diagram in the vicinity of $LiTaO_3$ has been reported by Miyazawa et al. in the Journal of Crystal Growth 10(1971) 276–278. Its congruent composition did not coincide with the stoichiometric composition and the phase relation is very similar to that of the $Li_2O$-$Nb_2O_5$ system. For producing lithium tantalate single-crystal with high compositional homogeneity, one conventional method known in the art comprises rotational pulling of crystal from a flux as combined with growing the crystal being pulled, in which the flux has a congruent melt composition of such that the crystal being grown and the flux are equilibrated to have the same composition, and has a molar fraction of $Li_2O/(Ta_2O_5+Li_2O)$ of being 0.4875. Since the as-grown lithium tantalate single-crystal thus produced in the method is in a multi-domain condition, it is subjected to poling treatment of applying a voltage thereto in the direction of the Z-axis of the crystal being heated at a temperature not lower than its Curie temperature of about 600° C. to thereby unipolarize the crystal, followed by cooling it. Then, the resulting, single-domain crystal is worked to have a predetermined size and used in various fields.

As having a favorable electrooptical constant and a favorable non-linear optical constant, the lithium tantalate single-crystal is widely noticed as a substrate material for optical modulators, optical switches, Q switches, frequency conversion devices, etc. Recently, in particular, expected is the development of waveguide-type, optical second-harmonic genetation (SHG) devices capable of converting a semiconductor and solid state lasers having a near infrared wavelength into UV or visible light having a semi-wavelength by means of a non-linear optical effect. Above all, most studied are SHG devices comprising an element of lithium tantalate single-crystal with its polarization structure being periodically inverted, as light sources for high-density recording and reproduction of optical discs. The SHG devices of that type are driven in a quasi-phase matching (QPM) system, in which the difference between the propagation constant of the fundamental wave and that of the higher harmonic wave is compensated for by the periodic structure to gain the phase matching. This system has many excellent characteristics in that its conversion efficiency is high, that parallel beaming and diffraction-limited collection of the light being outputted therefrom is easy, and that there is no limitation on the applicable material and wavelength. As the periodic structure for QPM, a structure of which the SHG coefficient (d coefficient) attribute is periodically inverted is most preferred for obtaining a high efficiency, and the positive or negative attribute of the d coefficient of ferroelectric crystal corresponds to the polarity of the ferroelectric polarization of the crystal. Therefore, the periodically-inverting structure of polarized ferroelectric domains is used in the QPM system. In the QPM-SHG system, usable are non-linear optical constants d22 and d33, which, however, could not be used in a phase matching system based on birefringence, and the QPM-SHG system of that type has the great advantage of high-efficiency wavelength conversion.

As compared with any other non-linear, optical single-crystal, lithium tantalate single-crystal has a large non-linear optical constant (d33 of −26.0 pm/V), and this is one of materials which have heretofore been most studied for producing optical devices comprising them. The most important technique for realizing QPM-SHG devices comprising ferroelectric crystal is to produce periodic polarization-inversion domains with accuracy. The phase matching period around the fundamental wavelength, 0.8 $\mu$m of lithium tantalate single-crystal is about 4 $\mu$m or so. However, the single-domain LT (lithium tantalate) single-crystal as prepared by poling the as-grown one is extremely stable around room temperature, and it is not easy to invert the polarity of the crystal in an ordinary electric field. In this connection, reported were some techniques for polarization inversion of LT single-crystal at a temperature not higher than the Curie point of the crystal by various methods. The reported methods include, for example, 1) $SiO_2$-charged thermal treatment, 2) proton-exchanging thermal treatment, 3) electron beam-scanning irradiation, and 4) voltage application. There are known many reports referring to the voltage application method 4). In one report, a periodic electrode is provided on one surface of a Z-cut LT single-crystal substrate, while a uniform electrode on the other surface thereof, and a pulse voltage is imparted to the crystal substrate via those electrodes to thereby obtain periodic polarization inversion of nearly the same pattern as that of the periodic electrode. By applying a near infrared laser to the QPM-SHG device thus produced in that manner, obtained is a blue SHG laser ray of a few mW or so. Except for SHG, QPM devices comprising LT single-crystal are further studied for application to wavelength conversion systems such as near infrared OPO, etc.

As has been mentioned hereinabove, the most important technique for realizing QPM-SHG devices comprising ferroelectric single-crystal is to produce periodic polarization-inversion domains with accuracy. Ideally, it is important to enlarge the overlapping of the inverted structure with the guided wave mode and to reduce the normalization matching error, or that is, to gain the polarization to inversion width ratio of 1/1. In fact, however, since the tolerance for the QPM condition is very narrow, the inversion period insufficiency, if any, in the devices produced ends in failure in realizing small-sized, high-efficiency devices. The method of electronic beam-scanning irradiation or voltage application to lithium tantalate crystal for the polarization inversion of the crystal will be advantageous in that inverted lattices which are nearly uniform in the direction of the thickness of the crystal are formed. Even in this, however, it is still extremely difficult to gain the polarization to inversion width ratio of being completely 1/1. In addition, the process itself is problematic in its reproducibility. For example, in the voltage application method, a periodic electrode is provided on one surface of a Z-cut lithium tantalate single-crystal substrate, while a uniform electrode on the other surface thereof, and a pulse voltage is imparted to the crystal substrate via those electrodes to thereby polarize and invert the area of the crystal substrate just below the periodic electrode, in the direction of the Z-axis of the crystal. In this, however, the inverted and polarized width of the crystal does not always correspond to the electrode width, and, in addition, the production error is great. Moreover, the method is further problematic in that the inversion will be often stopped in the middle of the formation of polarization and inversion on the Z-axis direction on the opposite surface of the crystal substrate, and that the polarized and inverted width will differ between the both surfaces of the Z-cut crystal substrate. For these reasons, therefore, it is difficult to produce ideal QPM-SHG devices according to this method.

The periodic width of polarization and inversion varies, depending on the phase-matching wavelength of the intended SHG device. For example, for long-wave phase matching, for example, in OPO devices, the inversion width to be controlled is large to be over ten $\mu$m or so. Therefore, the formation of long-wave devices is relatively easy as compared with that of short-wave ones in which the inversion width to be controlled is about 4 $\mu$m or so. However, the conventional methods could not still realize the production of ideal SHG devices. On the other hand, LT single-crystal requires a high voltage of not lower than 20 kV/mm for its polarization inversion. For a thin substrate of LT single-crystal having a thickness of 0.5 mm or so, it may be possible to produce polarized and inverted lattices throughout the entire substrate. However, thick substrates of LT single-crystal having a thickness of a few mm or so are problematic in that the production of complete polarization and inversion therein is difficult.

SUMMARY OF THE INVENTION

The present invention is to solve the problems noted above in the prior art, and to provide lithium tantalate single-crystal which is characterized in that it has a molar fraction of $Li_2O/(Ta_2O_5+Li_2O)$ of falling between 0.492 and 0.50 and that it requires a voltage of not larger than 10 kV/mm for its ferroelectric polarization inversion.

The invention also provides a photo-functional device comprising lithium tantalate single-crystal, in which the polarization structure of the crystal is periodically inverted to thereby shorten or prolong the wavelength of the laser ray being incident on the device and falling within a visible to near infrared range, and which is characterized in that the lithium tantalate single-crystal has a molar fraction of $Li_2O/(Ta_2O_5+Li_2O)$ of falling between 0.492 and 0.50.

As a result of our assiduous studies, we, the present inventors have found that the problems in controlling the polarization and inversion of lithium tantalate single-crystal result from the single-crystal material itself. On the basis of this finding, we have completed the present invention as in the above. Precisely, the conventional LT (lithium tantalate) single-crystal substrates that have heretofore been used for polarization and inversion are of tantalum-excessive lithium tantalate single-crystal having a molar fraction of $Li_2O/(Ta_2O_5+Li_2O)$ of 0.4875. This is because only such tantalum-excessive one is commercially available because of the limitation on the single-crystal growing technique in the art. Naturally, the ideal composition of lithium tantalate single-crystal has a ratio of Li/Ta of 1/1. The conventional LT single-crystal has many defects therein owing to the excessive tantalum component. The inventors have clarified the facts that, because of the defects existing in the LT single-crystal, the hysteresis which indicates the relationship between the voltage necessary for polarization inversion of the crystal and the spontaneous polarization thereof is asymmetric, that the crystal requires a high voltage of over 20 kV/mm for its polarization inversion, that the defects are unevenly distributed inside the crystal to cause easy pinning of polarization inversion in the site having many defects, and that, for those reasons, the technique of accurate polarization inversion of the conventional LT single-crystal by voltage application is limited.

Figure 1:
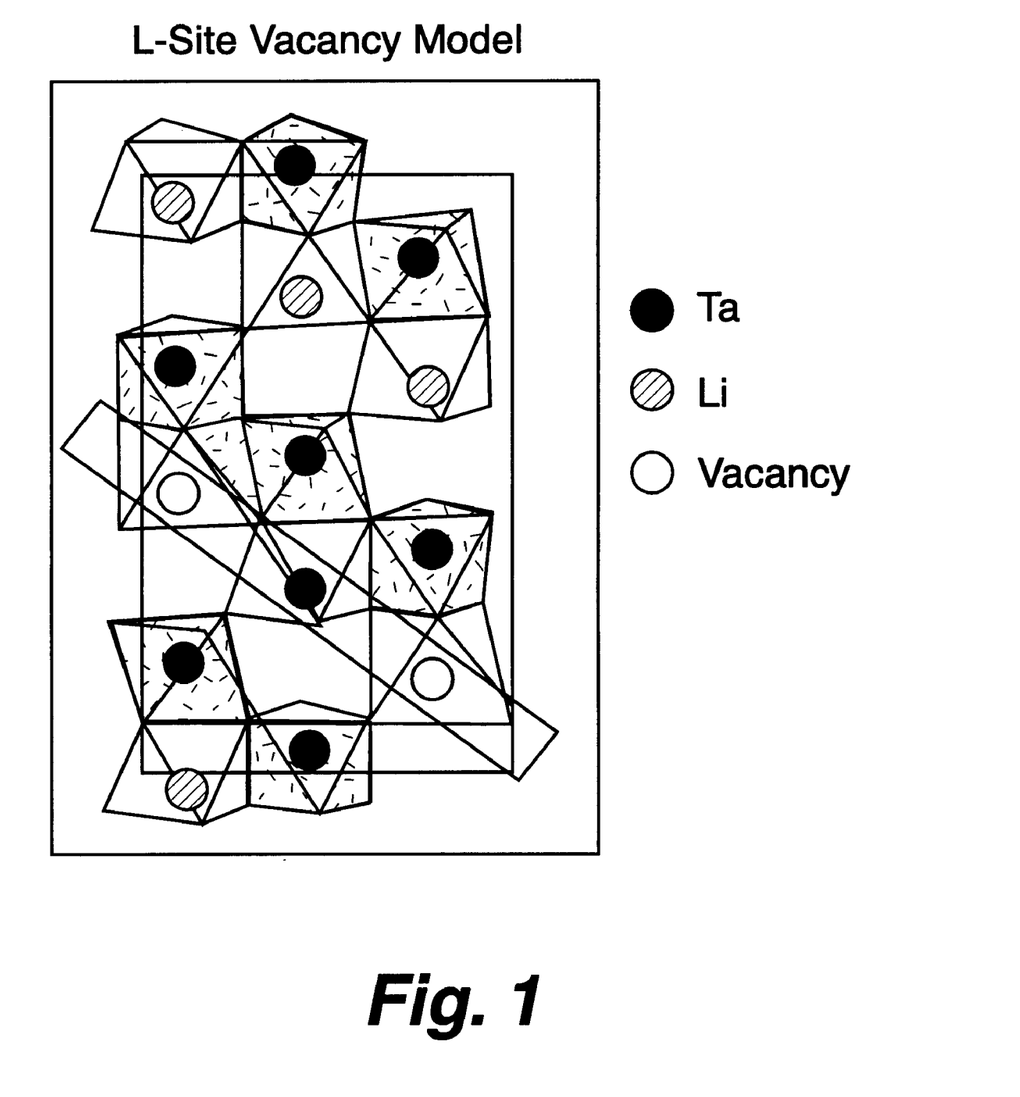
FIG. 1 is a graphical view showing a non-stoichiometric defect model of lithium tantalate (LT) single-crystal.

FIG. 1 is referred to, which shows a non-stoichiometric defect model of lithium tantalate single-crystal. In this, Li and Ta cations are positioned as ligands of oxygen-coordination octahedrons, and oxygen atoms exist at the apices of those octahedrons. LT single-crystal having a congruent melt composition contains an excessive Ta component therein. Therefore, in the LT single-crystal of that type, 1% of the excessive Ta ions occupy the Li ion site to give a vacancy to a degree of 4% in the Li site so as to keep the electric neutralization in the crystal. Having noted the large amount of the defects of reaching a few % in lithium tantalate single-crystal, the present inventors have assiduously studied the significant influence of those defects on the characteristics of the crystal. In lithium tantalate single-crystal which is in a paraelectric phase at a high temperature higher than the Curie point of the crystal, Li and Ta ions are positioned to be in a centro-symmetric condition; while in that in a ferroelectric phase at a temperature not higher than the Curie point of the crystal, Li and Ta ions are shifted in some degree in the z direction. Depending on the shifting direction of those ions, the polarization direction of the domains constituting the crystal is determined to be positive or negative. The technique of periodically inverting the polarization structure of crystal is to forcedly move the ions constituting the crystal at low temperatures by applying an electric field to the crystal. Where the crystal being treated by this technique has a congruent melt composition with many non-stoichiometric defects, Li ions are easily diffused and moved through the vacant sites in the crystal, but the excessive Ta ions having entered the Li sites are not easy to move. For these reasons, therefore, the crystal having such a congruent melt composition requires a large voltage for its polarization inversion. As opposed to this, it is believed that the polarization inversion of crystal having a nearly stoichiometric composition with reduced non-stoichiometric defects is easy.

Based on the matters mentioned above, the lithium tantalate single-crystal of the first aspect of the present invention is characterized in that the crystal has a nearly stoichiometric composition with a molar fraction of $Li_2O/(Ta_2O_5+Li_2O)$ of falling between 0.492 and 0.50, that the non-stoichiometric defect density in the crystal is reduced, that the voltage necessary for polarization inversion of the crystal is not larger than 10 kV/mm, or that is, smaller than that necessary for polarization inversion of the commercially-available lithium tantalate single-crystal having a congruent melt composition with many defects, and that the polarization inversion of the crystal causes no pinning as the defect density in the crystal is very low.

The second aspect of the invention is to provide a photo-functional device comprising lithium tantalate single-crystal, in which the polarization structure of the crystal is periodically inverted to thereby shorten or prolong the wavelength of the laser ray being incident on the device and falling within from near UV to near infrared range, and which is characterized in that the lithium tantalate single-crystal has a nearly stoichiometric composition.

DETAILED DESCRIPTION OF THE INVENTION

Now, the invention is described in more detail with reference to the preferred embodiments thereof.

The lithium tantalate single-crystal of the invention has a molar fraction of $Li_2O/(Ta_2O_5+Li_2O)$ of falling between 0.492 and 0.52, of which the chemical composition is nearer to its stoichiometric composition than that of ordinary lithium tantalate single-crystal having a congruent composition with a molar fraction of $Li_2O/(Ta_2O_5+Li_2O)$ of 0.4875. Accordingly, the crystal of the invention has a high degree of crystal perfectness while having a low defect density. In addition, it has good light transmission characteristics with little light scattering thereon, and the voltage necessary for its polarization inversion may be small or may be 10 kV/mm or lower. Therefore, accurate polarization inversion of the crystal within a minor range is possible. Accordingly, using the stoichiometric compositional, lithium tantalate single-crystal of the invention, it is possible to provide a wavelength-conversion device capable of efficiently converting the wavelength of rays falling within a broad range of from near UV rays to long-wave, near infrared rays.

To produce the lithium tantalate single-crystal of the invention, for example, employable is an ordinary pulling method where crystal is pulled from a flux having a greatly Li-excessive composition (for example, having a molar fraction of $Li_2O/(Ta_2O_5+Li_2O)$ of from 0.56 to 0.60, preferably 0.58). However, for growing large lithium tantalate single-crystal with more accurately controlling the non-stoichiometric defect density in the grown crystal and also the structure of the grown crystal, desired is a double-crucible method for single-crystal growing in which the raw material is continuously fed into the crucible.

Apart from the methods mentioned above, also employable herein are a pulling method where crystal is pulled from a flux having a stoichiometric composition or a congruent melt composition, to which is added an additive flux of $K_2O$ in an amount of not smaller than 5 wt % by weight, and even a top seeded solution growth (TSSG) method.

The invention is further described herein under with reference to the following Examples, which, however, are not intended to restrict the scope of the invention.

EXAMPLE 1

It can be seen from the analogy of $Li_2O$-$Ta_2O_5$ phase diagram to $Li_2O$-$Nb_2O_5$ system that the stoichiometric $LiTaO_3$ crystal coexists in equilibrium with a Li-rich melt $Li_2O/(Ta_2O_5+Li_2O)$ of from 0.56 to 0.60, preferably 0.58). Consequently, the stoichiometric lithium tantalate crystal must be grown from a Li-rich melt of the appropriate composition. A growth system, named double crucible Czochralski (DCCZ) method equipped with automatic powder supply system was designed by inventors to keep the Li-rich melt from which the stoichiometric lithium tantalate crystal is crystallized. Stoichiometric lithium tantalate crystal was grown from the Li-rich melt in the inner crucible by the Czochralski technique. Stoichiometric lithium tantalate powder was continuously supplied to the outer crucible by an automatic powder supply system at the same rate as the increase in weight of the growing crystal.

Powdery materials of commercially-available, high-purity $Li_2CO_3$ and $Ta_2O_5$ and were prepared. These were mixed in a ratio of $Li_2CO_3/Ta_2O_5$ falling between 0.56/0.44 and 0.60/0.40 to give Li-excessive mixtures, or in a ratio of $Li_2CO_3/Ta_2O_5=0.50/0.50$ to give a stoichiometric mixture. These mixtures were separately molded by isostatic rubber-press molding at a hydrostatic pressure of 1 ton/$cm^2$, and the resulting moldings were sintered in oxygen at about 1050 and 1250° C. to obtain sintered rod for crystal pulling and feeding powders, respectively. Next, lithium tantalate single-crystal having a nearly stoichiometric composition was grown according to a double-crucible method where the raw material was continuously fed into the crucible. Precisely, the seed crystal was put into a flux having an Li-excessive composition (for example, having a molar fraction of $Li_2O/(Ta_2O_5+Li_2O)$ of from 0.56 to 0.60 in the double-crucible, and pulled up at a pulling rate of 0.5 mm/hr and at a crystal revolution of 4 rpm to obtain lithium tantalate single-crystal having a nearly stoichiometric composition of which the non-stoichiometric defect density was minimized.

In order to more accurately control the non-stoichiometric defect density in the grown crystal and also the structure of the grown crystal, the stoichiometric mixture having a molar fraction of $Li_2O/(Ta_2O_5+Li_2O)$ of 0.50 was automatically fed into the outer crucible, while being correspondent to the amount of the grown crystal. After having been thus grown for about 1.5 weeks, obtained were colorless, transparent lithium tantalate single-crystal rods with no cracks, having a diameter of 40–55 mm and a length of 70 mm.

For their inside structure, the as-grown single-crystal rods were multi-domain condition. The as-grown crystals were first annealed at 1200° C. for 24 hours in air atmosphere in order to relieve the strain, and then were poled above the Curie temperature by the conventional field cooling method.

The lithium tantalate (LT) single-crystal samples obtained herein were subjected to chemical analysis for their composition and their Curie point was measured. Curie temperature was measured by differential thermal analysis (DTA). The crystal grown from the Li-rich melt ($Li_2O/(Ta_2O_5+Li_2O)=0.49$) exhibited a Curie temperature of 685° C., while that of the congruent melt composition $Li_2O/(Ta_2O_5+Li_2O)=0.4875$) crystals commercially produced was 601° C. On the other hand, the powder sintered from a stoichiometric mixture of $Li_2CO_3$ and $Ta_2O_5$ powders showed a Curie temperature of 690° C. On the basis of the data obtained, the samples were evaluated. The composition of the crystal obtained varied, depending on the composition of the flux. All the crystal samples obtained herein from Li-excess melt composition $Li_2O/(Ta_2O_5+Li_2O)=0.56–0.60$) were found to have a nearly stoichiometric composition with a molar fraction of $Li_2O/(Ta_2O_5+Li_2O)$ of falling between 0.492 and 0.50. In addition, it was further found that the crystal samples obtained herein all had a minimized non-stoichiometric defect density, as compared with conventional LT single-crystal having a congruent melt composition, and that every crystal sample had extremely good compositional homogeneity.

Figure 2:
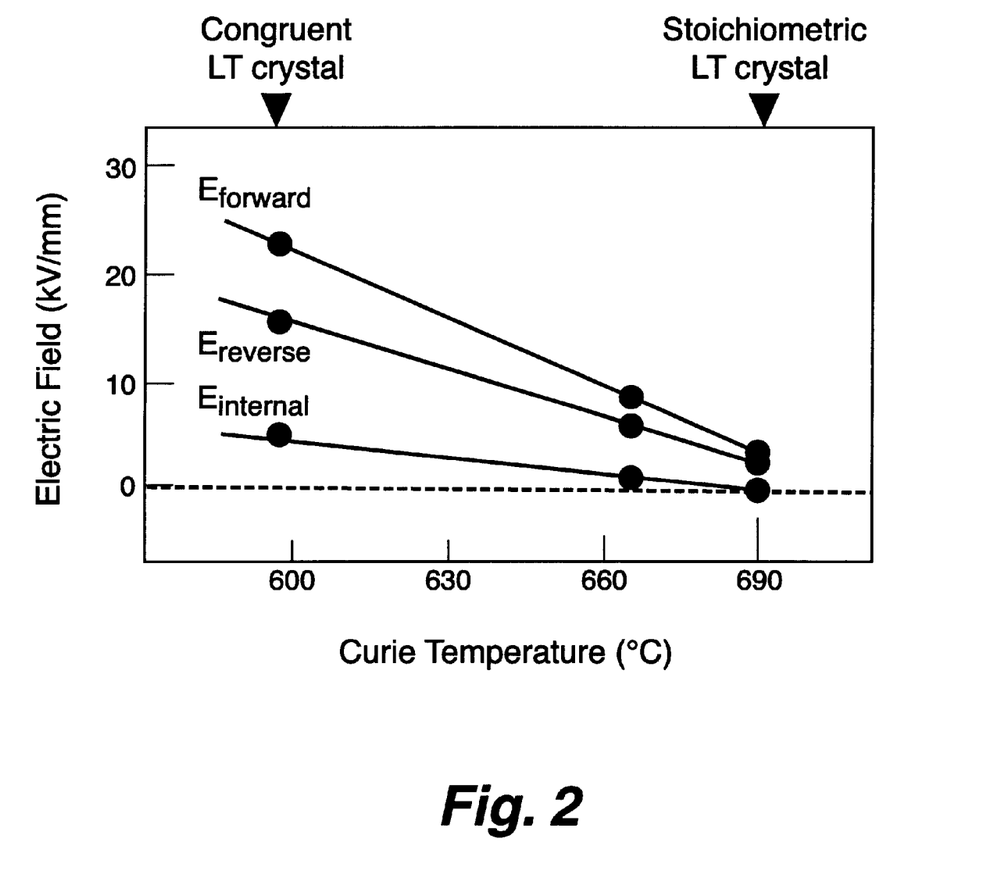
FIG. 2 is a graph comparatively showing the relationship between the Curie point and the ferroelectric characteristic of lithium tantalate (LT) single-crystal having a congruent melt composition and that of LT single-crystal having a stoichiometric composition.
Figure 3:
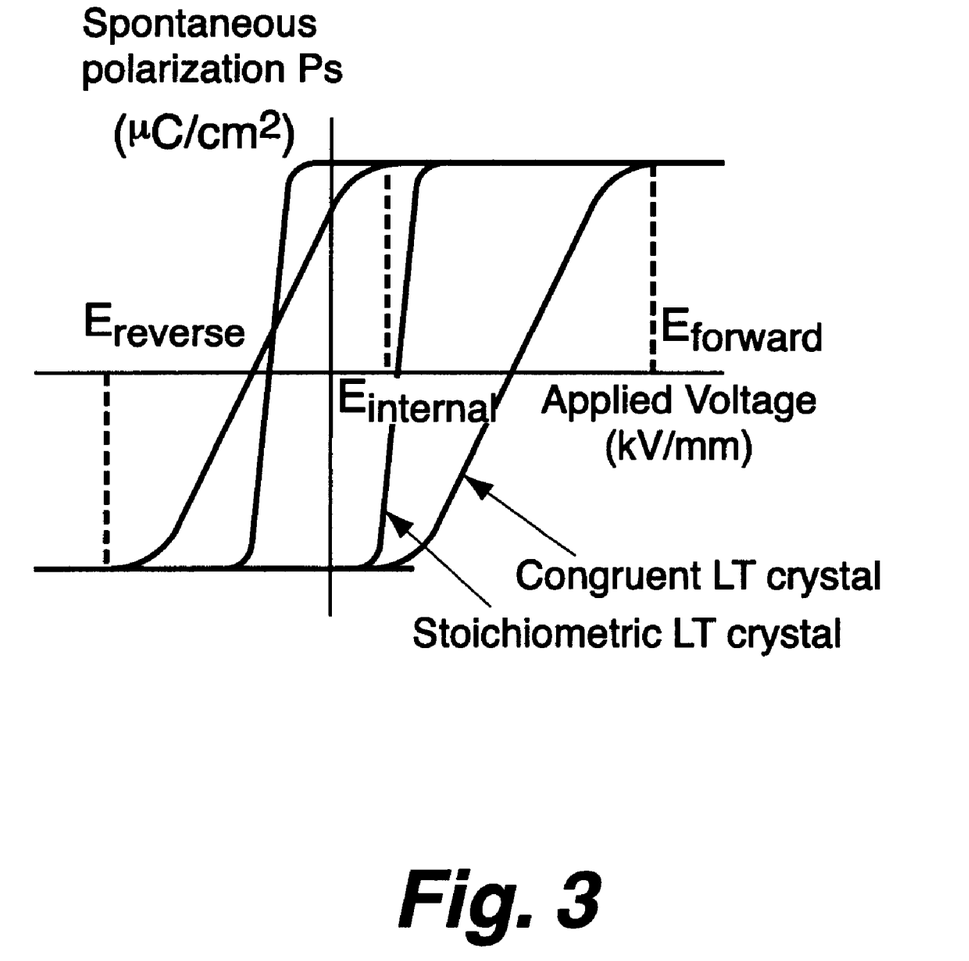
FIG. 3 is a graph showing the hysteresis characteristic of spontaneous polarization, relative to voltage applied, of lithium tantalate (LT) single-crystal having a congruent melt composition and that of LT single-crystal having a stoichiometric composition.
Figure 4:
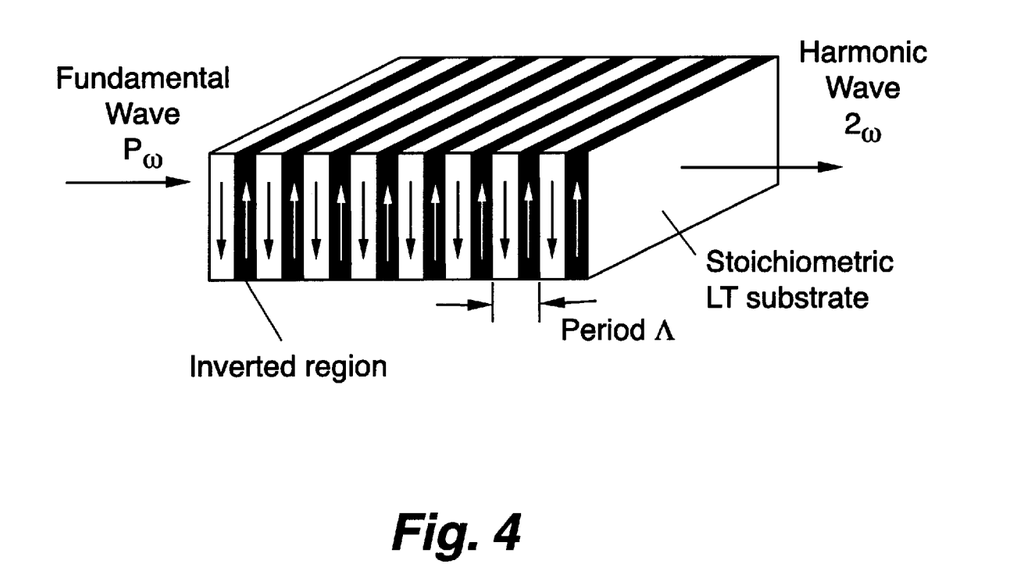
FIG. 4 is a graphical view showing a periodical polarization-inversion SHG photo-functional device having a substrate of lithium tantalate (LT) single-crystal.

Next, each crystal sample was cut into test pieces having a size of 10 mm×10 mm and a thickness of 0.5 mm, and then both z-surfaces were polished. An electrode was formed on the both Z-surfaces of each test piece, and a varying voltage was imparted to the test piece through the electrodes, whereupon the polarization-inversion voltage of the test piece was calculated from the change in the current having passed through the test piece. The data are shown in FIG. 2. As in FIG. 2, it is known that the polarization of the LT single-crystal samples of the present invention prepared herein was inverted at a voltage of lower than 10 kV/mm or 1.4 kV/mm for stoichiometric composition, while the voltage necessary for polarization inversion of the conventional LT single-crystal samples having a congruent melt composition was not lower than 20 kV/mm. The spontaneous polarization of the samples of the invention does not differ from that of the conventional samples. This means that the LT single-crystal of the invention is applicable to all uses to which the conventional LT single-crystal is applied. The hysteresis of the spontaneous polarization, relative to voltage applied, of LT single-crystal of the invention and that of the conventional LT single-crystal are shown in FIG. 3, from which it is known that the hysteresis of the LT single-crystal of the invention is more symmetrical than that of the conventional LT single-crystal. This means the excellent controllability of the LT single-crystal of the invention in the polarization inversion process of the crystal.

EXAMPLE 2

Herein produced were various photo-functional devices comprising a substrate of the lithium tantalate (LT) single-crystal that had been prepared in Example 1. In those devices, the polarization inversion of the substrate was periodically varied. First produced were QPM-SHG devices capable of emitting blue light or near UV light from the fundamental wave of a near infrared ray having a wavelength of 840 nm or 680 nm. Z-cut lithium tantalate (LT) single-crystal substrates, of which the both surfaces had been polished, were prepared, each having a diameter of 2 inches and a thickness of from 0.5 to 2 mm. On their +Z surface, formed was a comb-ike electrode patter of an Al film having a thickness of 500 nm, according to lithography. In order to form a primary QPM structure for efficiently generating blue and near UV harmonics, the periodic pitch of the electrode pattern was 3.6 $\mu$m and 1.7 $\mu$m. Next, an insulating film having a thickness of 0.5 $\mu$m was over-coated on the thus-patterned, +Z surface, and heated at 350° C. for 8 hours for storage treatment.

Next, the substrate was sandwiched between electrodes via an aqueous electric solution of lithium chloride on its both Z surfaces, to which was applied a high-voltage pulse. The current passing through the lithium tantalate (LT) crystal was monitored via a 1 k$\Omega$-resistor. In the samples comprising the lithium tantalate (LT) single-crystal of the invention, the domains in the crystal were inverted with a small voltage from 1.4 kV/mm to 10 KV/mm applied thereto, which is lower voltage to be applied to conventional LT devices for domain inversion. After the domain-inverted lattices were formed, the crystal was removed, and the side surface, Y-surface of the crystal was polished, and etched with a mixture of hydrofluoric acid and nitric acid. Then, the domain-inverted condition seen in the etched surface was checked. It was confirmed that the periodic domain to inversion width ratio and the domain profile were well regulated, by optimizing the pulse width and the current density of the voltage applied, to such that the periodic domain to polarization inversion width ratio could be an ideal ratio of 1/1 with accuracy throughout the entire region of the sample. The periodic domain inversion structure was accurately formed not only in the thin sample having a thickness of 0.5 mm but also in thick samples having a larger thickness, and it is believed that those samples are favorable for internal resonance-type wavelength conversion devices.

Next, wafers were cut out and their edges were polished. To these samples, applied were a semiconductor laser. In this test, the samples having a length of 10 mm were found to have a power of SHG output at a high conversion efficiency. The SH light output power of the device samples produced herein did not lower with the lapse of time, being different from that of QPM-SHG devices comprising a conventional single-crystal substrate having a congruent melt composition.

It has heretofore been said that the decrease in the SH light output power of the conventional QPM-SHG devices is because of the optical damage done to the single-crystal material itself in the devices. Though not having been clarified as yet at present, the following three reasons could be taken into consideration for the stable output of the QPM-SHG devices comprising a substrate of the stoichiometric compositional lithium tantalate single-crystal of the invention. The first reason is that the polarization inversion device of the invention has a small polarization inversion width of a few $\mu$m and that the polarization to inversion width ratio is a complete ratio of 1/1. Therefore, even though the device is optically damaged in some degree, the damaged area with anisotropy in the Z-axial direction in one domain could be offset by the others in the adjacent domains. The second reason is that, since the stoichiometric compositional LT single-crystal of the invention has a much lower non-stoichiometric defect density as compared with the conventional, congruent melt composition crystal, the photo-carrier in the former is influenced little by light scattering and has a large mobility, and therefore the photo-conductivity of he crystal of the invention is high. Like lithium niobate single-crystal containing MgO added thereto, it is believed that the crystal of the invention thus having a high photo-conductivity could cancel local photo-carriers that may cause optical damage, resulting in that little optical damage will be done to the crystal of the invention. The third reason is that, since the stoichiometric compositional crystal has a low non-stoichiometric defect density, it has few light-scattering factors and few macroscopic crystal defects such as striations, and therefore the light absorption by the crystal is very small. In particular, a thermal lens effect will cause optical damage to high-power SHG devices owing to the increase in the light absorption of fundamental waves and harmonic waves in those devices. However, it is believed that the stoichiometric LT single-crystal of the invention is free from those problems as its crystal perfectness is high and its light absorption is very small for a wide wavelength region.

The voltage application method has been described in detail herein as one example where the crystal polarization is inverted at a temperature not higher than the Curie point of the crystal, which, however, is not limitative. Apart from the disclosed method, the invention is applicable to any other methods of 1) $SiO_2$-charged thermal treatment, 2) proton-exchanging thermal treatment or 3) electron beam-scanning irradiation. As the stoichiometric compositional LT single-crystal of the invention is well-regulated, perfect crystal, it is possible in those methods to realize an optical device comprising the crystal and having periodic polarization inversion lattices formed therein with accuracy.

In the example described in detail herein, produced were QPM-SHG devices capable of generating blue or near UV light from the near infrared fundamental wave having a wavelength of 840 nm or 680 nm. However, in the invention, the fundamental waves are not limited to those two. The invention is applicable to any other waves falling within the range within which lithium tantalate singlecrystal is transparent and phase-matching of the crystal is possible. Especially stoichiometric lithium tantalate could be the best material as a QPM-SHG substrate for generating near UV and blue lasers since it has shortest absorption edge, 260 nm, which is about 15 nm and 30 nm shorter than the congruent lithium tantalate and lithium niobate crystal, respectively. In addition, the photo-functional device comprising lithium tantalate single-crystal of the invention, in which the polarization of the crystal is periodically inverted to thereby shorten or prolong the wavelength of a laser ray having a wavelength that falls within a range of from near UV rays to near infrared rays and being incident on the device, is not limited to only second-harmonic generation (SHG) devices, but may be used in other various fields of remote sensing, gas detection, etc., for example, as optical-parametric resonance devices.

EXAMPLE 3

Figure 5:
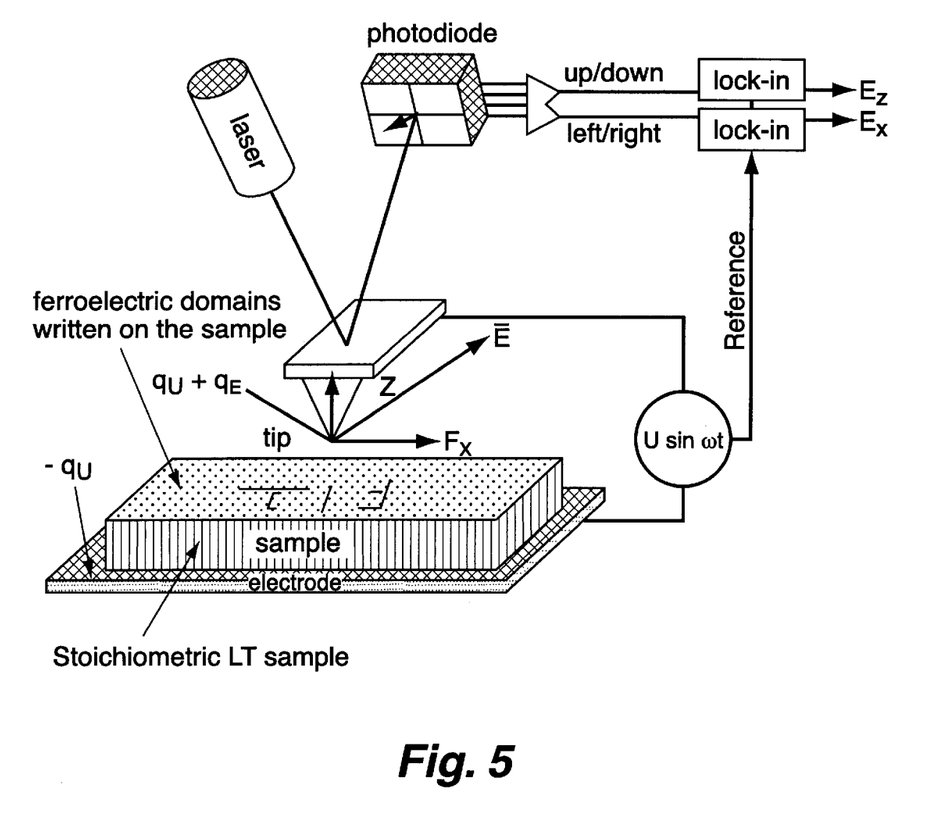
FIG. 5 is a graphical view showing a domain-inversion ferroelectric memory device having a substrate of lithium tantalate (LT) single-crystal.

Herein produced were various ferroelectric domain memory devices comprising a substrate of the lithium tantalate (LT) single-crystal that had been prepared in Example 1. In those devices, the small sized polarization inversion of ferroelectric domain in the substrate was used as a memory as shown in FIG. 5. As explained in example 1 and 2, the nearly stoichiometric lithium tantalate in this invention has advantages for the easiness of fabricating polarization inversion of ferroelectric domain, which is not easy for conventional congruent lithium tantalate single-crystal. Moreover, lithium tantalate has much smaller ferroelectric domains, smaller than microns-size, whereas lithium niobate has larger domain size of few centimeters. This means lithium tantalate have a potential to fabricate small size polarization inversion of ferroelectric domain which can be used as a ferroelectric memory. First, the Z-cut lithium tantalate (LT) single-crystal substrates, of which the both surfaces had been polished, were prepared, each having a size of 10 mm×20 mm and a thickness of from 0.2 to 1 mm. As shown in FIG. 5, Maxwell stress scanning force microscopy was used to visualize the domain structure. On their +Z surface, an ac voltage is applied between the conductive tip and the bottom electrode of the sample. The additional electrostatic force results in minute vibrations of the cantilever. Besides topographic surface features both the amplitude and phase of the induced vibration are monitored and represent the state of polarization of the sample. Therefore the surface dynamics as well as the formation of ferroelectric domains upon phase transition could be investigated. Direct modification of ferroelectric lithium tantalate samples of this invention was initiated with scanning force microscopy. Applying a suitable electric field between the conductive tip and the counter electrode results in permanently polarized areas. Such domains may be nucleated at any temperature below Curie temperature. This strongly depends on the coercive field strength at the particular temperature and the material in use. In this point nearly stoichiometric lithium tantalate in this invention could be the best substrate with lower domain switching coercive field. As an example the logo was written into lithium tantalate substrate was presented in the FIG. 5. While the line width approaches values less than 700 nm, also the time stability is significantly improved offering the possibility of the fabrication of physical devices on the nanometer scale.

As has been described in detail herein above, the present invention provides lithium tantalate single-crystal which requires a low voltage of not larger than 10 kV/mm for its polarization inversion and of which the polarization can be periodically inverted with accuracy even at such a low voltage, and provides a photo-functional device comprising the crystal. Thus, the invention is widely applicable to various optical techniques in various fields of optical information processing, optical working, photochemical reaction, optical instrumentation control and others where laser rays are used.

While the invention has been described in detail and with reference to specific embodiments thereof, it will be apparent to one skilled in the art that various changes and modifications can be made therein without departing from the spirit and scope thereof.

What is claimed is:

1. A lithium tantalate single-crystal, which has a molar fraction of $Li_2O/(Ta_2O_5+Li_2O)$ of falling between 0.492 and 0.50 and requires a voltage of not larger than 10 kV/mm for its ferroelectric polarization inversion.

2. The lithium tantalate single crystal of claim 1 wherein the required voltage for ferroelectric polarization inversion is not larger than 5 kV/mm.

3. The lithium tantalate single crystal of claim 1 wherein the polarization inversion is throughout the bulk substrate.

4. A photo-functional device comprising lithium tantalate single-crystal, in which the polarization structure of the crystal is periodically inverted to thereby shorten or prolong the wavelength of the laser ray being incident on the device and falling from near UV to near infrared range, and which is characterized in that the lithium tantalate single-crystal has a molar fraction of $Li_2O/(Ta_2O_5+Li_2O)$ of falling between 0.492 and 0.50.

5. The device of claim 4 wherein the polarization structure of the crystal is periodically inverted by applying a voltage of not larger than 5 kV/mm.

6. The device of claim 4 wherein the periodic inversion is throughout the bulk substrate.

7. A physical device comprising lithium tantalate single-crystal, in which the ferroelectric polarization of the crystal is inverted in a nanometer scale to thereby be used as a memory device, and which is characterized in that the lithium tantalate single-crystal has a molar fraction of $Li_2O/(Ta_2O_5+Li_2O)$ of falling between 0.492 and 0.50 with low coercive field.

* * * * *